US012615944B2

(12) United States Patent
Duan et al.

(10) Patent No.: US 12,615,944 B2
(45) Date of Patent: Apr. 28, 2026

(54) DISPLAY MODULE

(71) Applicant: WUHAN CHINA STAR OPTOELECTRONICS SEMICONDUCTOR DISPLAY TECHNOLOGY CO., LTD., Wuhan (CN)

(72) Inventors: Yanqiang Duan, Wuhan (CN); Feiming Lin, Wuhan (CN); Guangkun Zhang, Wuhan (CN); Xueyin Peng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 81 days.

(21) Appl. No.: 18/564,386

(22) PCT Filed: Jun. 13, 2023

(86) PCT No.: PCT/CN2023/100045
§ 371 (c)(1),
(2) Date: Nov. 27, 2023

(87) PCT Pub. No.: WO2024/244054
PCT Pub. Date: Dec. 5, 2024

(65) Prior Publication Data
US 2024/0407226 A1 Dec. 5, 2024

(30) Foreign Application Priority Data
May 31, 2023 (CN) .......................... 202310649281.2

(51) Int. Cl.
*H10K 59/80* (2023.01)

(52) U.S. Cl.
CPC .................................... *H10K 59/80* (2023.02)

(58) Field of Classification Search
CPC ............. H10K 2102/311; H10K 59/80; H10K 77/111; G09G 2380/02; G06F 1/1652; G06F 2203/04102
See application file for complete search history.

(56) References Cited

U.S. PATENT DOCUMENTS

2018/0242466 A1* 8/2018 Lee ........................ G06F 1/1652
2020/0411627 A1* 12/2020 Mochizuki ........... H10K 59/131
(Continued)

FOREIGN PATENT DOCUMENTS

CN 106449699 A 2/2017
CN 111478993 A 7/2020
CN 114822252 A 7/2022

OTHER PUBLICATIONS

Chinese Office Action issued in corresponding Chinese Patent Application No. 202310649281.2 dated Jan. 19, 2026, pp. 1-7, 14pp.

*Primary Examiner* — Robin J Mishler
(74) *Attorney, Agent, or Firm* — The Roy Gross Law Firm, LLC; Roy D. Gross

(57) ABSTRACT

The present disclosure provides a display module, including: a flexible display panel, including: a first straight portion; a second straight portion, located on a back side of a light exiting surface of the first straight portion; and a bending portion, connected to the first straight portion and the second straight portion, wherein an inner curved surface includes a bending start point and a bending end point, a spacing between the bending start point and the bending end point is D1, a spacing from a midpoint of a connecting line between the bending start point and the bending end point to an inner (Continued)

curved surface peak of the inner curved surface is D2, and D1 and D2 satisfy a formula as follows: D2<(D1)/2.

16 Claims, 5 Drawing Sheets

(56) References Cited

U.S. PATENT DOCUMENTS

| | | | |
|---|---|---|---|
| 2023/0156933 A1 | 5/2023 | Qin et al. | |
| 2023/0343261 A1* | 10/2023 | Seo | G09G 3/035 |
| 2024/0107858 A1* | 3/2024 | Park | H10K 50/87 |

* cited by examiner

DISPLAY MODULE

CROSS REFERENCE TO RELATED APPLICATIONS

This application claims the priority of International Application No. PCT/CN2023/100045, filed on Jun. 13, 2023, which claims the priority to Chinese Patent Application No. 202310649281.2, filed on May 31, 2023. The entire disclosures of the above applications are incorporated herein by reference.

FIELD OF INVENTION

The present disclosure relates to the field of display technologies, and in particular, to a display module.

BACKGROUND OF INVENTION

In a development process of smart terminals, to pursue an extremely large screen-to-body ratio, the size of a frame of a display module needs to be reduced as much as possible, thereby improving user experience.

SUMMARY OF INVENTION

Therefore, it is necessary to propose a technical solution to reduce the size of a frame of a flexible display module.

Technical Problem

An objective of the present disclosure is to provide a display module, to reduce the size of a frame of a display module.

Technical Solution

According to a first aspect, the present disclosure provides a display module, including:
a flexible display panel, including:
a first straight portion, comprising a light exiting surface;
a second straight portion, located on a back side of the light exiting surface of the first straight portion; and
a bending portion, connected to the first straight portion and the second straight portion, wherein an inner curved surface of the bending portion is connected to a rear surface of the light exiting surface of the first straight portion, the inner curved surface includes a bending start point and a bending end point, the bending start point is located at a connection between the bending portion and the first straight portion, the bending end point is located at a connection between the bending portion and the second straight portion, a spacing between the bending start point and the bending end point is D1, and a spacing from a midpoint of a connecting line between the bending start point and the bending end point to an inner curved surface peak of the inner curved surface is D2,
wherein D1 and D2 satisfy a formula as follows: $D2 < (D1)/2$.

Beneficial Effects

The spacing between the bending start point and the bending end point of the bending portion of the flexible display panel is D1, the spacing from the midpoint of the connecting line between the bending start point and the bending end point to the inner curved surface peak of the inner curved surface is D2, and $D2 < (D1)/2$. Through such a design, D1 may be kept unchanged or reduced slightly, so as not to reduce or to slightly reduce a thickness of a modular stack below the flexible display panel, so that while the mechanical performance of the display module is basically not reduced, the spacing D2 from the midpoint of the connecting line between the bending start point and the bending end point to the inner curved surface peak of the inner curved surface is small. In this way, a size of a lower frame occupied by the bending portion of the flexible display panel is reduced, to further reduce a size of the lower frame of the display module.

REFERENCE NUMERALS

100. display module; 100*a*. display region; 100*b*. non-display region; and 100*b*1. bending region;

10. flexible display panel; 101. first straight portion; 101a. light exiting surface; 102. second straight portion; 103. bending portion; 103a. inner curved surface; 103b. outer curved surface; A. bending start point; B. bending end point; O. midpoint; P. inner curved surface peak; first direction x; second direction y;

12. backplate; 121. first backplate; 121a. first end surface; 122. second backplate;

122a. second end surface; 123. groove; 123a. initial groove;

14. protective layer; 14a. first region; 14b. second region; 141. initial protective layer;

15. functional layer; 15a. third end surface;

18. protective cover plate;

20. support assembly; 201. rigid support layer;

221. first bonding layer; 222. second bonding layer; 223. third bonding layer; 224. fourth bonding layer; 225. fifth bonding layer; and 226. sixth bonding layer.

DETAILED DESCRIPTION OF PREFERRED EMBODIMENTS

The following clearly and completely describes the technical solutions in the embodiments of the present disclosure with reference to the accompanying drawings in the embodiments of the present disclosure. Apparently, the described embodiments are only some of the embodiments of the present disclosure rather than all of the embodiments. All other embodiments obtained by a person skilled in the art based on embodiments of the present disclosure without creative efforts shall fall within the protection scope of the present disclosure.

Figure 1:
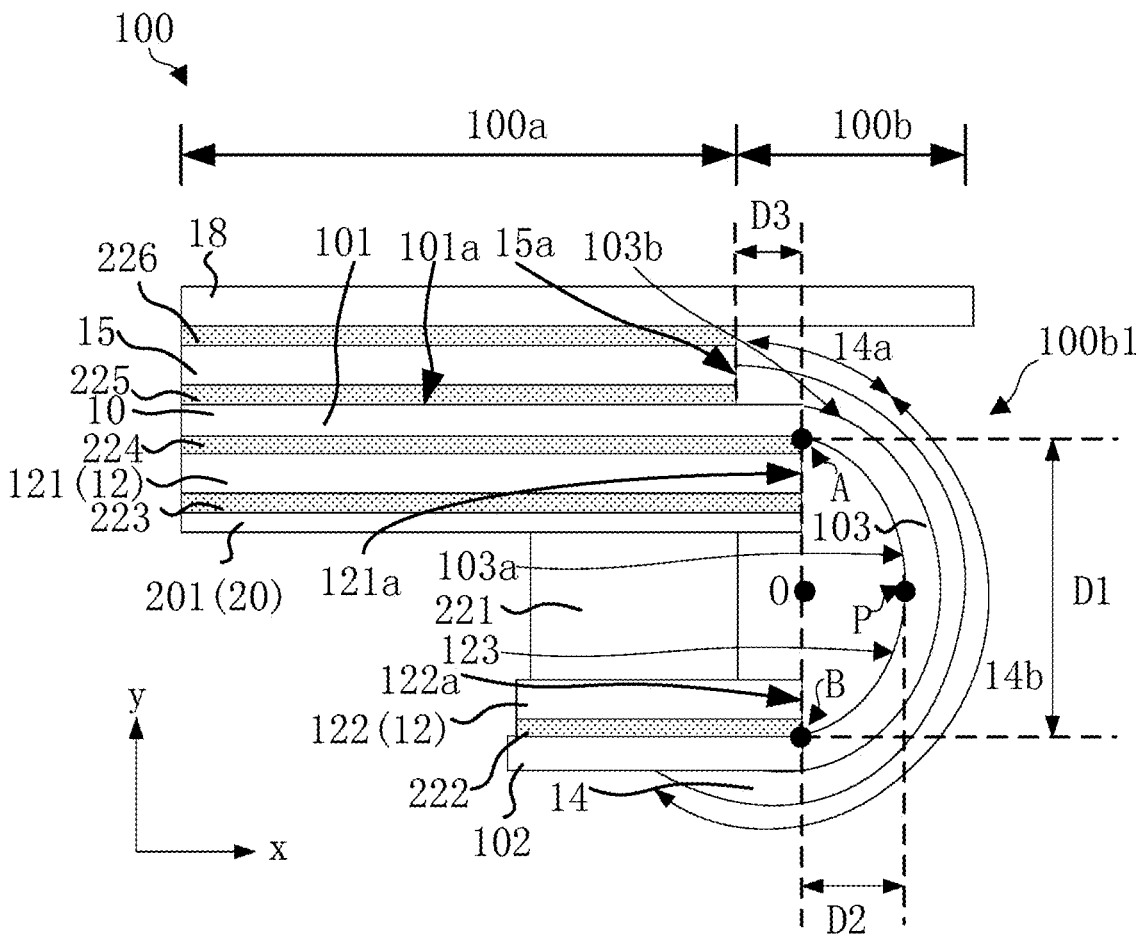
FIG. 1 is a schematic cross-sectional view of a display module according to an embodiment of the present disclosure.

Referring to FIG. 1, the present disclosure provides a display module 100. The display module 100 comprises a display region 100a and a non-display region 100b that are disposed adjacently in a first direction x. The non-display region 100b includes a bending region 100b1. The display module 100 includes a flexible display panel 10 and a backplate 12, and the flexible display panel 10 is located on the backplate 12.

The flexible display panel 10 includes a driving substrate (not shown) and a light-emitting device layer (not shown) disposed on the driving substrate. The driving substrate is located in the display region 100a and the non-display region 100b, and the light-emitting device layer is located in the display region 100a. The driving substrate includes a substrate and a driving circuit layer disposed on the substrate, and the light-emitting device layer is disposed on the driving circuit layer. Specifically, the flexible display panel 10 is a flexible organic light-emitting diode (LED) display panel, but is not limited thereto.

The flexible display panel 10 includes a first straight portion 101, a second straight portion 102, and a bending portion 103. The first straight portion 101 includes the light-emitting device layer and comprises a light exiting surface 101a, the light exiting surface 101a is located in the display region 100a, and the first direction x and the light exiting surface 101a are parallel. The second straight portion 102 is located on a back side of the light exiting surface 101a of the first straight portion 101. The bending portion 103 connects the first straight portion 101 and the second straight portion 102. The driving circuit layer is located in the first straight portion 101, the second straight portion 102, and the bending portion 103.

The first straight portion 101 and the second straight portion 102 are both straight. The first straight portion 101 and the second straight portion 102 are disposed parallel to each other. It may be understood that the second straight portion 102 may be disposed obliquely relative to the first straight portion 101.

The bending portion 103 is located in the bending region 100b1, and the bending portion 103 is in a bent state, so that the second straight portion 102 is located on the back side of the light exiting surface 101a of the first straight portion 101, to reduce a size of the non-display region 100b, and further make a lower frame of the display module 100 narrow.

The bending portion 103 includes an inner curved surface 103a and an outer curved surface 103b, and the outer curved surface 103b is disposed facing away from the inner curved surface 103a. The inner curved surface 103a is connected to a rear surface of the light exiting surface 101a of the first straight portion 101. The inner curved surface 103a includes a bending start point A, a bending end point B, and an inner curved surface peak P, the bending start point A is located at a connection between the bending portion 103 and the first straight portion 101, the bending end point B is located at a connection between the bending portion 103 and the second straight portion 102, and the inner curved surface peak P is located at a peak of the inner curved surface 103a. A spacing between the bending start point A and the bending end point B is D1. A spacing from a midpoint O of a connecting line between the bending start point A and the bending end point B to the inner curved surface peak P is D2.

A connecting line between the bending start point A and the bending end point B is parallel to a second direction y, and the second direction y intersects the first direction x. In other words, the bending start point A and the bending end point B are aligned in the second direction y. Specifically, the second direction y is perpendicular to the first direction x, but is not limited thereto. It may be understood that, an angle between the second direction y and the first direction x may be an acute angle or obtuse angle.

D1 and D2 satisfy a formula as follows: $D2<(D1)/2$. Through such a design, D1 may be kept unchanged or reduced slightly, so as not to reduce or to slightly reduce a thickness of a modular stack below the flexible display panel, so that while the mechanical performance of the display module is basically not reduced, the spacing D2 from the midpoint O of the connecting line between the bending start point A and the bending end point B to the inner curved surface peak P of the inner curved surface 103a is small. In this way, space occupied by the bending portion 103 of the bending region 100b1 in the first direction x is reduced, to further reduce the size of the non-display region 100b. In other words, a size of the lower frame of the display module 100 is reduced, to further increase a screen-to-body ratio of the display module.

Specifically, a cross-section of the bending portion 103 in the second direction y comprises a semielliptical arc shape or an approximately semielliptical arc shape. The bending start point A and the bending end point B are two peaks of a major axis of the semielliptical arc shape, and the inner curved surface peak P is one peak of a minor axis of the semielliptical arc shape. In addition, each of the inner curved surface 103a and the outer curved surface 103b includes an elliptical arc-shaped curved surface, and in a direction of the inner curved surface 103a extending from the bending start point A to the bending end point B, a spacing between a point in a region between the bending start point A and the inner curved surface peak P and the midpoint O decreases, and a spacing between a point in a region between the inner curved surface peak P and the bending end point B and the midpoint O increases.

It should be noted that, in some related technologies, a bending portion of a flexible display panel is bent in a semiarc shape. When a bending radius of the bending portion is large, a lower frame of a display module is large, which is not conducive to a narrow frame design of the display module. When the bending radius of the bending portion is small to reduce the size of the lower frame of the display module, in one aspect, a stress value at a bending peak of the bending portion is large, and a risk that a wire in the bending portion ruptures is increased. In another aspect, a thickness of the display module is clearly reduced. As the thickness of the display module is clearly reduced, the mechanical performance of the display module is reduced, making it difficult for the display module to pass mechanical performance tests such as a compression test, a drop ball test, and the like.

In the present disclosure, the cross-section of the bending portion 103 in the second direction y comprises a semielliptical arc shape or an approximately the semielliptical arc shape, the spacing between the bending start point A and the bending end point B is D1, the spacing between the midpoint O of the connecting line between the bending start point A and the bending end point B and the inner curved surface peak P is D2, and D2<(D1)/2. Through such a design, space occupied by the bending portion 103 in the first direction x is reduced, so that while the size of the lower frame of the display module is reduced, because a size of the bending portion 103 in the second direction y may still be kept unchanged or may still be slightly reduced, it is conducive to ensure the thickness of the display module, to further mitigate the problem in the related art that the thickness of the display module is clearly reduced and as a result the mechanical performance is reduced. In addition, a size of the bending portion 103 in the first direction x is reduced, and the size of the bending portion 103 in the second direction y may still be kept unchanged or may still be slightly reduced, which can also mitigate the problem in the related art that the bending radius of the bending portion is small and as a result stress is excessively large. As can be seen, compared with the related art, in the present disclosure, while a narrow frame design of the lower frame of the display module is achieved, the mechanical performance of the display module as a whole is ensured, and a risk that stress on the bending portion of the flexible display panel is large and as a result a wire inside the bending portion ruptures is reduced.

Referring to FIG. 1, the backplate 12 protects a rear surface of the flexible display panel 10. The backplate 12 includes a first backplate 121, a second backplate 122, and a groove 123. The first backplate 121 is connected to the first straight portion 101. The second backplate 122 is connected to the second straight portion 102.

The groove 123 overlaps the bending portion 103. A material of the backplate 12 includes an organic insulating material such as polyimide, polyethylene terephthalate, or the like.

In the present embodiment, the first backplate 121 comprises a first end surface 121a close to the bending portion 103, and the first end surface 121a overlaps the bending start point A. The second backplate 122 comprises a second end surface 122a close to the bending portion 103, and the second end surface 122a overlaps the bending end point B. The first end surface 121a and the second end surface 122a are aligned in the second direction y.

Figure 2:
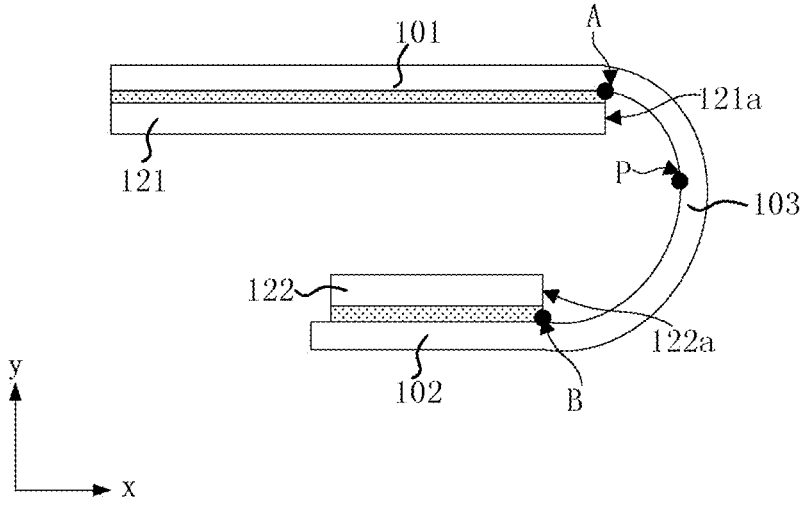
FIG. 2 is a schematic diagram of a left misalignment of a second end surface of a second backplate close to a bending portion relative to a first end surface of a first backplate close to the bending portion of the display module shown in FIG. 1.
Figure 3:
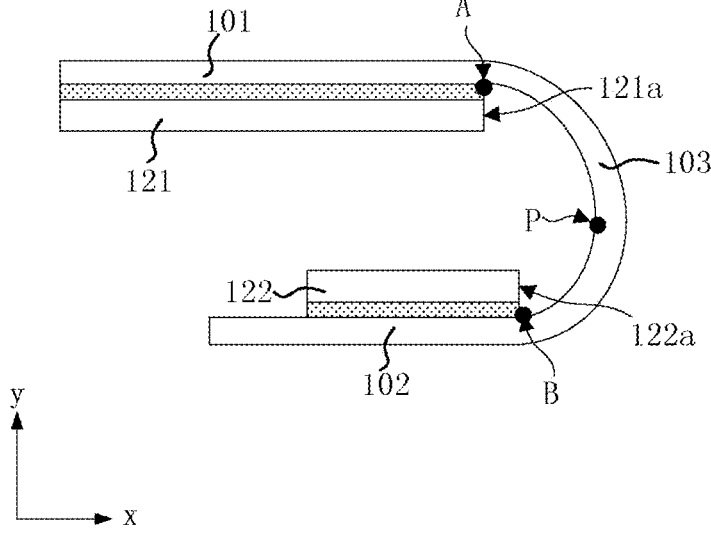
FIG. 3 is a schematic diagram of a right misalignment of a second end surface of a second backplate close to a bending portion relative to a first end surface of a first backplate close to the bending portion of the display module shown in FIG. 1.

In other embodiments, referring to FIGS. 2 and 3, the first end surface 121a and the second end surface 122a may be staggered. In the first direction x, a misalignment distance between the first end surface 121a and the second end surface 122a is less than or equal to 200 micrometers. As shown in FIG. 2, the second end surface 122a is located on a side of the first end surface 121a away from the bending portion 103, which is referred to as a left misalignment of the second backplate 122 for short. As shown in FIG. 3, the second end surface 122a is located on a side of the first end surface 121a close to the bending portion 103, which is referred to as a right misalignment of the second backplate 122 for short.

It should be noted that, in some embodiments of the present disclosure, to meet an assembly requirement, or due to an error in another process such as an assembly process, the first end surface 121a and the second end surface 122a are staggered.

Figure 4:
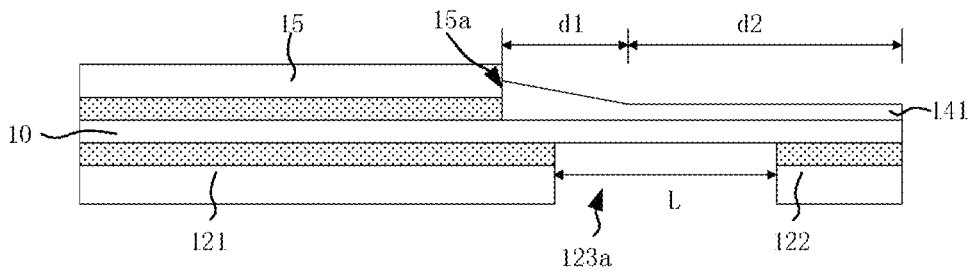
FIG. 4 is a partial schematic diagram of a display module when a flexible display panel shown in FIG. 1 is in a flattened state and backplates are in a flattened state.

In the present embodiment, referring to both FIGS. 1 and 4, when the flexible display panel 10 is in a flattened state, the backplate 12 is in a flattened state, a surface of the first backplate 121 close to the flexible display panel 10 and a surface of the second backplate 122 close to the flexible display panel of the backplate 12 in a flattened state are located in one plane, the plane is perpendicular to a thickness direction of the flexible display panel, and a spacing L between the first backplate 121 and the second backplate 122 of the backplate 12 in a flattened state satisfies a formula as follows: wherein $L=\pi(D2+kh)+2((D1)/2-D2)$, wherein k is greater than 0 and less than 1, and h is a thickness of the flexible display panel 10.

The spacing L between the first backplate 121 and the second backplate 122 is controlled through the foregoing formula, so that the second straight portion 102 of the flexible display panel 10 is bent to the back side of the light exiting surface 101a of the first straight portion 101 through the bending portion 103, and when the second backplate 122 is located on a side of the first backplate 121 away from the first straight portion 101, the cross-section of the bending portion 103 in the second direction y comprises a semielliptical arc shape or an approximately semielliptical arc shape. In addition, the design of D2+kh in the formula to adjust a neutral plane of the bending portion 103 of the flexible display panel 10 to be located between the inner curved surface 103a and the outer curved surface 103b, to reduce stress on wiring inside the bending portion 103, and reduce a risk that the wiring inside the bending portion 103 ruptures due to excessively high stress. In addition, in the design of the foregoing formula $L=\pi(D2+kh)+2((D1)/2-D2)$, k is greater than 0 and less than 1, so that an adjustable range of the spacing L between the first backplate 121 and the second backplate 122 is larger.

It should be noted that, a manufacturing process of the first backplate 121 and the second backplate 122 shown in FIG. 1 includes: bonding the flexible display panel 10 in a flattened state on an initial backplate (not shown) through an adhesive layer, and performing groove opening on the initial backplate and the adhesive layer, to obtain an initial groove 123a shown in FIG. 4, wherein the remaining initial backplate includes the first backplate 121 and the second backplate 122 that are coplanar and disposed at an interval. Next, a part of the flexible display panel 10 in a flattened state overlapping the initial groove 123a is bent. After the bending portion 103 is formed, the initial groove 123a is bent to turn into the groove 123. As can be seen, the form of the bending portion 103 of the flexible display panel 10 may be adjusted by adjusting a size of the initial groove 123a, that is, by adjusting the spacing L between the first backplate 121 and the second backplate 122.

It should further be noted that, in the related art, to ensure that the bending portion comprises a semiarc shape, a groove with a small size needs to be manufactured in the initial backplate, and correspondingly, a spacing between the first backplate and the second backplate is small. However, when the groove with a small size is manufactured in the initial backplate, the difficulty of performing die cutting on the initial backplate is increased. In the present disclosure, to ensure that the cross-section of the bending portion 103 in the second direction y comprises a semielliptical arc shape or an approximately semielliptical arc shape, a design value of the spacing L between the first backplate 121 and the second backplate 122 is larger, so that the problem in the related art that the difficulty of performing die cutting on the initial backplate is large can be mitigated.

In the present embodiment, k is greater than or equal to 0.2 and less than or equal to 0.8, so that the neutral plane of the bending portion 103 of the flexible display panel 10 is closer to a central position between the inner curved surface 103a and the outer curved surface 103b, to further reduce stress on a central part between the inner curved surface 103a and the outer curved surface 103b.

For example, k may be 0.1, 0.2, 0.3, 0.4, 0.5, 0.7, 0.8, 0.9, or 0.95.

Specifically, k=0.5, so that the neutral plane of the bending portion 103 of the flexible display panel 10 is located at the central position between the inner curved surface 103a and the outer curved surface 103b, to reduce stress on the central part of the bending portion 103 of the flexible display panel 10 located between the inner curved surface 103a and the outer curved surface 103b.

In the present embodiment, D1 and D2 further satisfy a formula as follows: $0.7 \leq D2/((D1)/2)$. Due to such a design, when the second end surface 122a of the second backplate 122 is misaligned relative to the first end surface 121a of the first backplate 121, it is conducive to mitigating that problem that stress on one of the second end surface 122a of the second backplate 122 and the first end surface 121a of the first backplate 121 is less than stress at the inner curved surface peak P, to further reduce stress on the second end surface 122a of the second backplate 122 and the first end surface 121a of the first backplate 121, and further reduce a risk that the second backplate 122 or the first backplate 121 collapse due to excessively high stress.

In the present embodiment, $0.85 \leq D2/((D1)/2) \leq 0.95$, so that while the size of the lower frame of the display module 100 is further reduced, when the second end surface 122a of the second backplate 122 is misaligned relative to the first end surface 121a of the first backplate 121, the stress on the second end surface 122a of the second backplate 122 and the first end surface 121a of the first backplate 121 is further reduced.

For example, the value of $D2/((D1)/2)$ may be 0.7, 0.75, 0.8, 0.85, 0.9, or 0.95.

In the present embodiment, referring to FIG. 1, the display module 100 further includes a protective layer 14. A part of the protective layer 14 is located on the outer curved surface 103b of the bending portion 103 facing away from the inner curved surface 103a, and two opposite ends of the protective layer 14 are located on the first straight portion 101 and the second straight portion 102, to protect the bending portion 103. A material of the protective layer 14 includes an ultraviolet curing adhesive.

In an extension direction of the protective layer 14, the protective layer 14 comprises a first region 14a and a second region 14b that are adjacently disposed. A thickness of the protective layer 14 in the first region 14a changes gradually.

A thickness of the protective layer 14 in the second region 14b is constant. In other words, thicknesses of the protective layer 14 at different positions in the second region 14b are the same or basically the same. A minimum value of the thickness of the protective layer 14 in the first region 14a is larger than the thickness of the protective layer 14 in the second region 14b. The first region 14a overlaps the bending start point A and/or the bending end point B. Through such a design, the protective layer 14 comprises a large thickness at positions overlapping the bending start point A and/or the bending end point B, to increase stiffness of the bending portion 103 of the flexible display panel 10 at the bending start point A and/or the bending end point B, thereby reducing stress at the bending start point A and/or the bending end point B.

Furthermore, in the extension direction of the protective layer 14, at least one of the second end surface 122a of the second backplate 122 and the first end surface 121a of the first backplate 121 overlaps the first region 14a, to reduce stress on the at least one of the second end surface 122a of the second backplate 122 and the first end surface 121a of the first backplate 121.

Specifically, as shown in FIG. 1, the protective layer 14 located in the first region 14a includes a first part and a second part. The first part is located on the first straight portion 101 of the non-display region 100b, and the second part is located in the bending region 100b1 and is connected to the first part. In the first region 14a, in a direction extending from an end of the protective layer 14 located on the first straight portion 101 to an end of the protective layer 14 located on the second straight portion 102, the thickness of the protective layer 14 decreases. The protective layer 14 located in the second region 14b includes a third part. The third part is located in the bending region 100b1 and is connected to the second part. In the second region 14b, the thickness of the protective layer 14 remains unchanged, and correspondingly, a thickness of the third part remains unchanged.

In the present embodiment, the first region 14a overlaps the bending start point A and the first end surface 121a of the first backplate 121, to increase the stiffness of the bending portion 103 of the flexible display panel 10 at the bending start point A, thereby reducing the stress at the bending start point A, and reducing stress on the first end surface 121a of the first backplate 121.

In other embodiments, in the extension direction of the protective layer 14, the first region 14a may overlap the bending end point B and the second end surface 122a of the second backplate 122, or, the first region 14a overlaps all the bending start point A, the bending end point B, the second end surface 122a, and the first end surface 121a.

In the present embodiment, a maximum value of the thickness of the protective layer 14 in the first region 14a is greater than or equal to 120 micrometers and less than or equal to 160 micrometers, so that while stiffness of a part of the flexible display panel 10 overlapping the first region 14a is increased, bendability of the protective layer 14 in the first region 14a is ensured. When the maximum value of the thickness of the protective layer 14 is less than 120 micrometers, it is difficult to make the part of the flexible display panel 10 overlapping the first region 14a have sufficient stiffness. When the maximum value of the thickness of the protective layer 14 is greater than 160 micrometers, the bendability of the protective layer 14 is reduced.

The thickness of the protective layer 14 in the second region 14b is greater than or equal to 60 micrometers and less than or equal to 80 micrometers, so that the protective layer 14 comprises good flexibility.

For example, the maximum value of the thickness of the protective layer 14 in the first region 14a is 120 micrometers, 130 micrometers, 140 micrometers, 150 micrometers, or 160 micrometers. The thickness of the protective layer 14 in the second region 14b is 60 micrometers, 70 micrometers, or 80 micrometers.

Referring to FIG. 1, the display module 100 further includes a functional layer 15. The functional layer 15 is located on a side of the first straight portion 101 away from the second straight portion 102. The functional layer 15 is fixed on the light exiting surface 101a of the first straight portion 101 through an adhesive layer, and the functional layer 15 contacts an end of the protective layer 14 located on the first straight portion 101.

The functional layer 15 includes at least one of a polarizer and a protective film. A material of the protective film includes, but not limited to, polyethylene terephthalate. Specifically, the functional layer 15 includes a polarizer.

In the present embodiment, a spacing D3 between a third end surface 15a of the functional layer 15 contacting the protective layer 14 and the bending start point A and the first end surface 121a of the first backplate 121 in the first direction x is less than a size of the first region 14a in the extension direction of the protective layer 14, to ensure that in the extension direction of the protective layer 14, the first region 14a of the protective layer 14 overlaps the bending start point A and the first end surface 121a of the first backplate 121.

Specifically, the size of the first region 14a in the extension direction of the protective layer 14 is greater than or equal to 250 micrometers and less than or equal to 500 micrometers.

Referring to FIG. 4, a manufacturing process of the protective layer 14 shown in FIG. 1 includes: applying an initial adhesive layer (not shown) on the flexible display panel 10 in a flattened state, wherein the initial adhesive layer is located on surface of the flexible display panel 10 in a flattened state away from the second backplate 122, the initial adhesive layer contacts the functional layer 15, an initial protective layer 141 is obtained after the initial adhesive layer is irradiated with ultraviolet light, and the initial protective layer 141 is bent to turn into the protective layer 14 shown in FIG. 1.

Before the initial adhesive layer is irradiated with ultraviolet light, because of a mutual force between the initial adhesive layer and the functional layer 15, in a range of a distance from the third end surface 15a being d1, a thickness of the initial adhesive layer decreases, and a thickness of the initial adhesive layer close to the third end surface 15a is large. In a range of the distance from the third end surface 15a being larger than d1 and less than or equal to d1+d2, the thickness of the initial adhesive layer is the same.

After the initial adhesive layer is irradiated with ultraviolet light, the initial adhesive layer is cured to form the initial protective layer 141, and in the range of the distance from the third end surface 15a being d1, a thickness of the initial protective layer 141 decreases, and a thickness of the initial protective layer 141 close to the third end surface 15a is large. In the range of the distance from the third end surface 15a being larger than d1 and less than or equal to d1+d2, the thickness of the initial protective layer 141 is the same. After initial protective layer 141 is bent to turn into the protective layer 14, in the first region 14a, in a direction from a position close to the third end surface 15a to a position away from the third end surface 15a, the thickness of the protective layer 14 decreases.

d1 is greater than or equal to 250 micrometers and less than or equal to 500 micrometers. In the foregoing, the spacing D3 between the third end surface 15a of the functional layer 15 and the first end surface 121a of the first backplate 121 is controlled, so that a region in which the thickness of the protective layer 14 changes gradually can overlap the bending region 100b1, and further the first region 14a of the protective layer 14 overlaps the bending start point A and the first end surface 121a of the first backplate 121, to improve stiffness of the flexible display panel at the bending start point A, and reduce stress at the bending start point A and on the first end surface 121a of the first backplate 121. In the present embodiment, the display module 100 further includes a support assembly 20. The support assembly 20 is disposed between the first backplate 121 and the second backplate 122. The support assembly 20 includes, but not limited to, at least one of a rigid support layer and a cushioning layer.

Specifically, as shown in shown in FIG. 1, the support assembly 20 includes a rigid support layer 201. The rigid support layer 201 is fixed on a surface of the first backplate 121 away from the first straight portion 101 through an adhesive layer. A material of the rigid support layer 201 includes metal. The metal includes, but not limited to, steel.

In other embodiments, the display module 100 may not include the support assembly 20 such as a rigid support layer, a cushioning layer, or the like.

In the present embodiment, the display module 100 further includes a first bonding layer 221. The first bonding layer 221 bonds the rigid support layer 201 and the second backplate 122, to fix the second backplate 122 on the rigid support layer 201.

In the present embodiment, in a case that the functional layer 15 is a polarizer, the display module 100 further includes a protective cover plate 18. The protective cover plate 18 is fixed on a side of the functional layer 15 away from the light exiting surface 101a through the adhesive layer.

It should be noted that, in a case that the functional layer 15 is a protective film, the display module 100 does not include the protective cover plate 18.

Referring to shown in FIG. 1, the display module 100 further includes a second bonding layer 222. The second bonding layer 222 is located between the second straight portion 102 and the second backplate 122, and bonds the second straight portion 102 and the second backplate 122.

The display module 100 further includes a third bonding layer 223. The third bonding layer 223 is located between the rigid support layer 201 and the first backplate 121, and bonds the rigid support layer 201 and the first backplate 121.

The display module 100 further includes a fourth bonding layer 224. The fourth bonding layer 224 is located between the first backplate 121 and the first straight portion 101, and bonds the first backplate 121 and the first straight portion 101. A thickness of the fourth bonding layer 224 is same as that of the second bonding layer 222.

A material of the second bonding layer 222, the third bonding layer 223, and the fourth bonding layer 224 includes, but not limited to, a pressure-sensitive adhesive.

In the present embodiment, the display module 100 further includes a fifth bonding layer 225. The fifth bonding layer 225 is located between the functional layer 15 and the first straight portion 101, and bonds the functional layer 15 and the first straight portion 101.

In the present embodiment, the display module 100 further includes a sixth bonding layer 226. The sixth bonding layer 226 is located between the functional layer 15 and the protective cover plate 18.

A material of the fifth bonding layer 225 and the sixth bonding layer 226 includes, but not limited to, an optical adhesive.

It should be noted that, a spacing D1 between the bending start point A and the bending end point B is also equal to the thickness of the modular stack located between the second straight portion 102 and the first straight portion 101. For example, the spacing D1 is equal to a sum of the thickness of the fourth bonding layer 224, a thickness of the first backplate 121, a thickness of the third bonding layer 223, a thickness of the rigid support layer 201, a thickness of the first bonding layer 221, a thickness of the second backplate 122, and the thickness of the second bonding layer 222.

FIGS. 5 to 8 are experimental test diagrams of stress on wiring of a source/drain metal layer in a flexible display panel at different positions in different cases of a bending portion of the flexible display panel and under conditions of alignment, left misalignment, and right misalignment of a second backplate and a first backplate of a display module.

Figure 5:
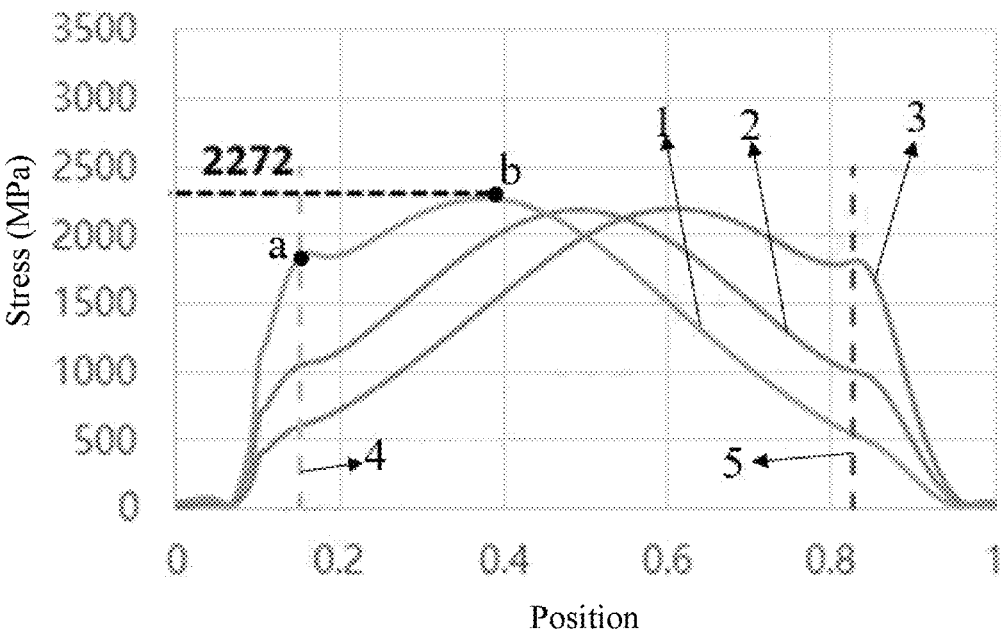
FIG. 5 is an experimental test diagram of stress on wiring of a source/drain metal layer in a flexible display panel at different positions in a case that a bending portion of the flexible display panel is bent in a semiarc shape and a bending radius is 0.23 millimeters and under conditions of alignment, left misalignment, and right misalignment of a second backplate and a first backplate of a display module.
Figure 6:
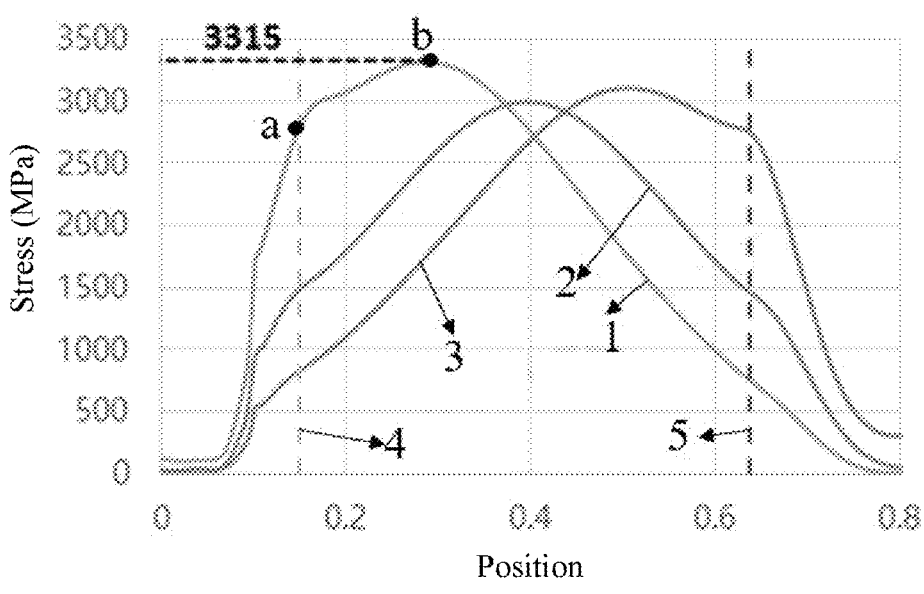
FIG. 6 is an experimental test diagram of stress on wiring of a source/drain metal layer in a flexible display panel at different positions in a case that a bending portion of the flexible display panel is bent in a semiarc shape and a bending radius is 0.17 millimeters and under conditions of alignment, left misalignment, and right misalignment of a second backplate and a first backplate of a display module.

FIG. 5 corresponds to an experimental test diagram in a case that the bending portion of the flexible display panel is bent in a semiarc shape and a bending radius is 0.23 millimeters. FIG. 6 corresponds to an experimental test diagram in a case that the bending portion of the flexible display panel is bent in a semiarc shape and a bending radius is 0.17 millimeters.

Figure 7:
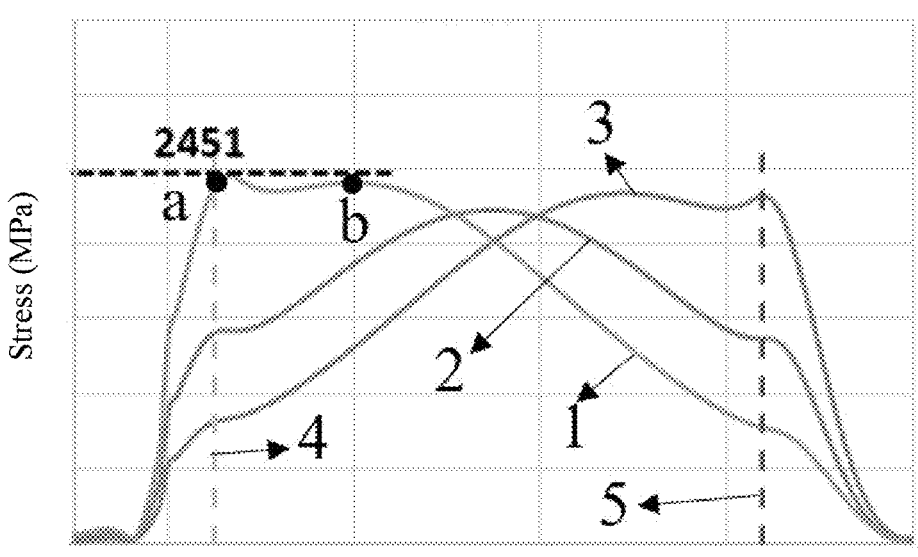
FIG. 7 is an experimental test diagram of stress on wiring of a source/drain metal layer in a flexible display panel at different positions in a case that a bending portion of the flexible display panel is bent in a semielliptical shape shown in FIG. 1, (D1)/2 is 0.23 millimeters, and D2 is 0.17 millimeters and under conditions of alignment, left misalignment, and right misalignment of a second backplate and a first backplate of a display module.
Figure 8:
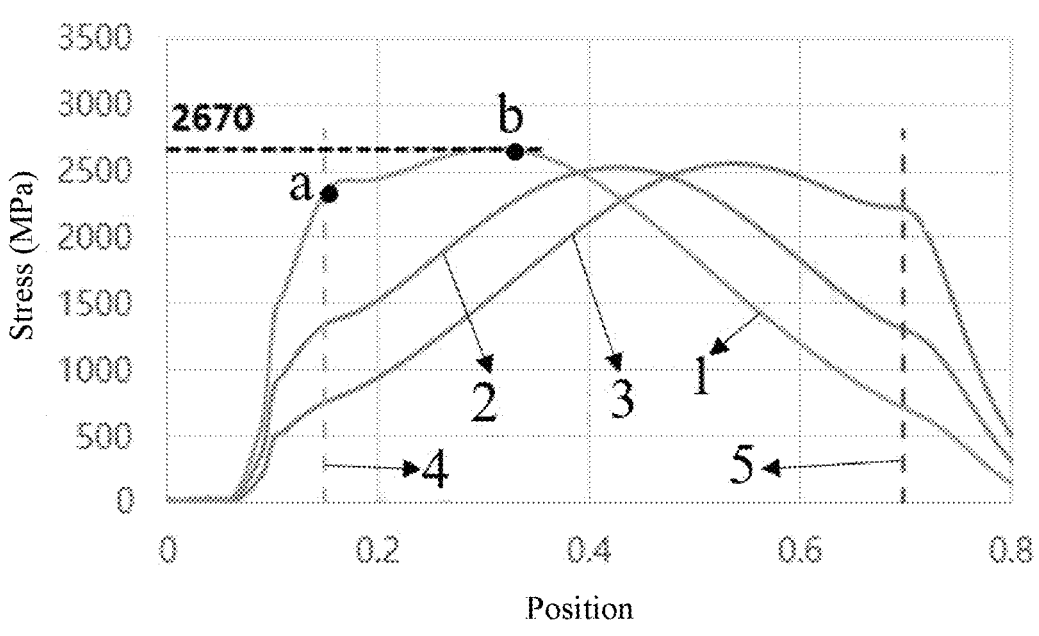
FIG. 8 is an experimental test diagram of stress on wiring of a source/drain metal layer in a flexible display panel at different positions in a case that a bending portion of the flexible display panel is bent in a semielliptical shape shown in FIG. 1, (D1)/2 is 0.20 millimeters, and D2 is 0.17 millimeters and under conditions of alignment, left misalignment, and right misalignment of a second backplate and a first backplate of a display module.

FIG. 7 is an experimental test diagram in a case that a bending portion of the flexible display panel is bent in a semielliptical shape shown in FIG. 1, (D1)/2 is 0.23 millimeters, and D2 is 0.17 millimeters. FIG. 8 is an experimental test diagram in a case that a bending portion of the flexible corresponds to the bending end point B. A point a denotes stress at the bending starting position of the source/drain metal layer. A point b denotes stress at a bending peak position of the source/drain metal layer, and a bending peak position of the source/drain metal layer corresponds to and overlaps a bending peak P.

Under the condition of alignment, the second end surface of the second backplate close to the bending portion is aligned with the first end surface of the first backplate close to the bending portion. For details, refer to a position relationship between the second backplate and the first backplate shown in FIG. 1. Under the condition of left misalignment, the second end surface of the second backplate close to the bending portion is located on a side of the first end surface of the first backplate close to the bending portion away from the bending portion, and a distance between the second end surface and the first end surface in the first direction x is 160 micrometers. For details, refer to a position relationship between the second backplate and the first backplate shown in FIG. 2. Under a condition of right misalignment, the second end surface of the second backplate close to the bending portion is located on a side of the first end surface of the first backplate close to the bending portion close to the bending portion, and the distance between the second end surface and the first end surface in the first direction x is 160 micrometers. For details, refer to the position relationship between the second backplate and the first backplate shown in FIG. 3.

The following Table 1 shows experimental test results of maximum stress on the wiring of the source/drain metal layer in the flexible display panel at the bending starting position of the source/drain metal layer and the bending peak position of the source/drain metal layer under conditions of alignment, left misalignment, and right misalignment of the second backplate and the first backplate of the display module.

TABLE 1

| Form of the bending portion | Related parameters of the bending portion | Maximum stress (MPa) on the wiring of the source/drain metal layer at the bending starting position of the source/drain metal layer | Maximum stress (MPa) on the wiring of the source/drain metal layer at the bending peak position of the source/drain metal layer |
|---|---|---|---|
| Semiarc-shaped | The bending radius is 0.23 millimeters | 1853 | 2272 |
| | The bending radius is 0.17 millimeters | 2766 | 3315 |
| Semielliptical arc shape shown in FIG. 1 | (D1)/2 is 0.23 millimeters and D2 is 0.17 millimeters | 2451 | 2411 |
| | (D1)/2 is 0.20 millimeters and D2 is 0.17 millimeters | 2428 | 2670 | display panel is bent in a semielliptical shape shown in FIG. 1, (D1)/2 is 0.20 millimeters, and D2 is 0.17 millimeters.

Furthermore, in FIGS. 5 to 8, a line 1 is a stress curve under a condition of left misalignment, a line 2 is a stress curve under a condition of alignment, and a line 3 is a stress curve under a condition of right misalignment. A dash line 4 corresponds to that a bending starting position of the source/drain metal layer, and the bending starting position of the source/drain metal layer corresponds to and overlaps the bending start point A. A dash line 5 corresponds to a bending ending position of the source/drain metal layer, and the bending ending position of the source/drain metal layer As can be seen with reference to Table 1, in a case that the bending portion of the flexible display panel of the display module comprises a semiarc shape, the bending radius of the bending portion of the flexible display panel is directly reduced from 0.23 millimeters to 0.17 millimeters, to reduce the lower frame of the display module by 0.06 millimeters. As a result, the maximum stress on the wiring of the source/drain metal layer in the flexible display panel at the bending peak position of the source/drain metal layer is increased by 45.9%. In addition, because the thickness of the modular stack below the flexible display panel in a case that the bending portion of the flexible display panel comprises a semiarc shape is twice the bending radius, the bending radius of the bending portion of the flexible display panel is directly reduced from 0.23 millimeters to 0.17 millimeters. As a result, the thickness of the modular stack below the flexible display panel needs to be reduced by 0.12 millimeters, and further the mechanical performance of the display module is clearly reduced.

In the present disclosure, the bending portion comprises a semielliptical arc shape, (D1)/2 is 0.23 millimeters, and D2 is 0.17 millimeters. The lower frame of the display module is reduced by 0.06 millimeters, and it can further be ensured that the thickness of the display module does not require thinning, to ensure that the mechanical performance of the display module, and the maximum stress on the wiring of the source/drain metal layer in the flexible display panel at the bending peak position of the source/drain metal layer is only increased by 6.1%.

In addition, in the present disclosure, in a case that the bending portion comprises a semielliptical arc shape, (D1)/2 is 0.20 millimeters, and D2 is 0.17 millimeters, the thickness of the display module is reduced by 0.06 millimeters, so that the mechanical performance of the display module basically remains unchanged or is slightly reduced, and the lower frame of the display module can be reduced by 0.06 millimeters, and the maximum stress on the wiring of the source/drain metal layer in the flexible display panel at the bending peak position of the source/drain metal layer is only increased by 17.5%.

Furthermore, as can be seen with reference to Table 1 and FIGS. 4 to 8, when the bending portion comprises a semielliptical arc shape, in a case that (D1)/2 is 0.23 millimeters and D2 is 0.17 millimeters, and in a case that (D1)/2 is 0.20 millimeters and D2 is 0.17 millimeters, the maximum stress on the wiring of the source/drain metal layer at the bending peak position of the source/drain metal layer is clearly less than the maximum stress on the wiring of the source/drain metal layer at the bending peak position of the source/drain metal layer when the bending portion comprises a semiarc shape and the bending radius of the bending portion is 0.17 millimeters.

Therefore, in the design of the display module of the present disclosure, while the size of the lower frame of the display module is reduced, the thickness of the display module is not reduced or is slightly reduced, to ensure the mechanical performance of the display module, and mitigate the problem that stress on the bending portion of the flexible display panel of the display module is large.

In addition, as can be seen with reference to FIGS. 7 and 8, In the present disclosure, when the bending portion comprises a semielliptical arc shape, compared with conditions of left misalignment and right misalignment, under the condition of alignment, stress at the bending starting position, the bending peak position, and the bending ending position is relatively small.

In addition, as can be seen with reference to the foregoing description, for the problem that the stress at the bending starting position and the bending ending position is relatively large under the conditions of left misalignment and right misalignment, in the present disclosure, the first region 14*a* of the protective layer 14 overlaps the bending start point A and/or the bending end point B, and it is combined that $0.7 \leq D2/((D1)/2)$, so that the stress at the bending starting position and the bending ending position is relatively large under the conditions of left misalignment and right misalignment is reduced.

It should be noted that, the left misalignment and right misalignment may be caused by some actual process errors, in the present disclosure, the design in the foregoing embodiments is propose by taking into consideration both an alignment condition with no process error and a case of a condition of left misalignment or right misalignment caused by a process error.

In summary, in the present disclosure, under any of conditions of alignment, left misalignment, and right misalignment, while the lower frame of the display module is narrowed, the thickness of the display module is not reduced or is slightly reduced, to ensure the mechanical performance of the display module, and stress on the bending portion of the flexible display panel of the display module at the bending starting position and the bending ending position is small.

The descriptions of the foregoing embodiments are only used to help understand the technical solutions and core ideas of the present disclosure. A person of ordinary skill in the art is to understand that modifications may still be made to the technical solutions described in the foregoing embodiments or equivalent replacements may be made to some technical features thereof, as long as such modifications or replacements do not cause the essence of corresponding technical solutions to depart from the scope of the technical solutions of the embodiments of the present disclosure.

What is claimed is:

1. A display module, comprising:

a flexible display panel, comprising:

a first straight portion, comprising a light exiting surface;

a second straight portion, located on a back side of the light exiting surface of the first straight portion; and a bending portion, connected to the first straight portion and the second straight portion, wherein the bending portion comprises an elliptical arc-shaped curved surface, an inner curved surface of the bending portion is connected to a rear surface of the light exiting surface of the first straight portion, the inner curved surface comprises a bending start point and a bending end point, the bending start point is located at a connection between the bending portion and the first straight portion, the bending end point is located at a connection between the bending portion and the second straight portion, a spacing between the bending start point and the bending end point is D1, and a spacing from a midpoint of a connecting line between the bending start point and the bending end point to an inner curved surface peak of the inner curved surface is D2, wherein D1 and D2 satisfy a formula as follows: $D2 < (D1)/2$, and $0.7 \leq D2/((D1)/2)$;

wherein the display module further comprises a backplate, the flexible display panel is located on the backplate, and the backplate comprises:

a first backplate, connected to the first straight portion;

a second backplate, connected to the second straight portion; and a groove, overlapping the bending portion, wherein when the flexible display panel is in a flattened state, the backplate is in a flattened state, a surface of the first backplate close to the flexible display panel and a surface of the second backplate close to the flexible display panel of the backplate in a flattened state are located in one plane, the plane is perpendicular to a thickness direction of the flexible display panel, and a spacing L between the first backplate and the second backplate of the backplate in a flattened state satisfies a formula as follows:

15

$L=\pi(D2+kh)+2 ((D1)/2-D2)$, wherein k is greater than 0 and less than 1, and h is a thickness of the flexible display panel.

2. The display module as claimed in claim 1, wherein D1 and D2 further satisfy a formula as follows:

$$0.85 \le D2/(D1)/2) \le 0.95.$$

3. The display module as claimed in claim 1, wherein k is greater than or equal to 0.2 and less than or equal to 0.8.

4. The display module as claimed in claim 1, wherein the display module further comprises:

a protective layer, wherein a part of the protective layer is located on an outer curved surface of the bending portion facing away from the inner curved surface, and two opposite ends of the protective layer are separately located on the first straight portion and the second straight portion, wherein in an extension direction of the protective layer, the protective layer comprises a first region and a second region that are adjacent, a thickness of the protective layer in the first region changes gradually, a thickness of the protective layer in the second region is constant, a minimum value of the thickness of the protective layer in the first region is larger than the thickness of the protective layer in the second region, and the first region overlaps the bending start point and/or the bending end point.

5. The display module as claimed in claim 4, wherein the display module further comprises:

a functional layer, located on a side of the first straight portion away from the second straight portion, wherein the functional layer contacts an end of the protective layer located on the first straight portion, and a spacing between an end surface of the functional layer contacting the protective layer and the bending start point in a direction intersecting a thickness direction of the first straight portion is less than a size of the first region in the extension direction of the protective layer.

6. The display module as claimed in claim 5, wherein the size of the first region in the extension direction of the protective layer is greater than or equal to 250 micrometers and less than or equal to 500 micrometers.

7. The display module as claimed in claim 4, wherein a maximum value of the thickness of the protective layer in the first region is greater than or equal to 120 micrometers and less than or equal to 160 micrometers.

8. The display module as claimed in claim 1, wherein in a direction of the inner curved surface extending from the bending start point to the bending end point, a spacing between a point in a region between the bending start point and the inner curved surface peak and the midpoint decreases, and a spacing between a point in a region between the inner curved surface peak and the bending end point and the midpoint increases.

9. A display module, comprising:

a flexible display panel, comprising:

a first straight portion, comprising a light exiting surface;

a second straight portion, located on a back side of the light exiting surface of the first straight portion; and a bending portion, connected to the first straight portion and the second straight portion, wherein an inner curved surface of the bending portion is connected to a rear surface of the light exiting surface of the first straight portion, the inner curved surface comprises a bending start point and a bending end point, the bending start point is located at a connection between the bending portion and the first straight portion, the bending end point is located at a connection between the bending portion and the second straight portion, a spacing between the bending start point and the bending end point is D1, and a spacing from a midpoint of a connecting line between the bending start point and the bending end point to an inner curved surface peak of the inner curved surface is D2, wherein D1 and D2 satisfy a formula as follows: D2< (D1)/2;

wherein the display module further comprises:

a protective layer, wherein a part of the protective layer is located on an outer curved surface of the bending portion facing away from the inner curved surface, and two opposite ends of the protective layer are separately located on the first straight portion and the second straight portion, wherein in an extension direction of the protective layer, the protective layer comprises a first region and a second region that are adjacent, a thickness of the protective layer in the first region changes gradually, a thickness of the protective layer in the second region is constant, a minimum value of the thickness of the protective layer in the first region is larger than the thickness of the protective layer in the second region, and the first region overlaps the bending start point and/or the bending end point;

wherein the display module further comprises a backplate, the flexible display panel is located on the backplate, and the backplate comprises:

a first backplate, connected to the first straight portion;

a second backplate, connected to the second straight portion; and a groove, overlapping the bending portion, wherein when the flexible display panel is in a flattened state, the backplate is in a flattened state, a surface of the first backplate close to the flexible display panel and a surface of the second backplate close to the flexible display panel of the backplate in a flattened state are located in one plane, the plane is perpendicular to a thickness direction of the flexible display panel, and a spacing L between the first backplate and the second backplate of the backplate in a flattened state satisfies a formula as follows:

wherein $L=\pi(D2+kh)+2 ((D1)/2-D2)$, wherein k is greater than 0 and less than 1, and h is a thickness of the flexible display panel.

10. The display module as claimed in claim 9, wherein D1 and D2 further satisfy a formula as follows:

$$0.7 \le D2/((D1)/2).$$

11. The display module as claimed in claim 10, wherein D1 and D2 further satisfy a formula as follows:

$$0.85 \le D2/((D1)/2) \le 0.95.$$

12. The display module as claimed in claim 9, wherein k is greater than or equal to 0.2 and less than or equal to 0.8.

13. The display module as claimed in claim 9, wherein the display module further comprises:

a functional layer, located on a side of the first straight portion away from the second straight portion, wherein the functional layer contacts an end of the protective layer located on the first straight portion, and a spacing between an end surface of the functional layer contacting the protective layer and the bending start point in a direction intersecting a thickness direction of the first straight portion is less than a size of the first region in the extension direction of the protective layer.

14. The display module as claimed in claim 13, wherein the size of the first region in the extension direction of the protective layer is greater than or equal to 250 micrometers and less than or equal to 500 micrometers.

15. The display module as claimed in claim 9, wherein a maximum value of the thickness of the protective layer in the first region is greater than or equal to 120 micrometers and less than or equal to 160 micrometers.

16. The display module as claimed in claim 9, wherein in a direction of the inner curved surface extending from the bending start point to the bending end point, a spacing between a point in a region between the bending start point and the inner curved surface peak and the midpoint decreases, and a spacing between a point in a region between the inner curved surface peak and the bending end point and the midpoint increases.

\* \* \* \* \*